United States Patent
Letts

(10) Patent No.: US 9,541,579 B2
(45) Date of Patent: Jan. 10, 2017

(54) METHODS AND SYSTEMS FOR GENERATING DISPLAYS OF WAVEFORMS

(71) Applicant: Peter J. Letts, Beaverton, OR (US)

(72) Inventor: Peter J. Letts, Beaverton, OR (US)

(73) Assignee: TEKTRONIX, INC., Beaverton, OR (US)

( * ) Notice: Subject to any disclaimer, the term of this patent is extended or adjusted under 35 U.S.C. 154(b) by 542 days.

(21) Appl. No.: 13/626,305

(22) Filed: Sep. 25, 2012

(65) Prior Publication Data

US 2014/0088900 A1  Mar. 27, 2014

(51) Int. Cl.
G01R 13/30 (2006.01)
G01R 13/20 (2006.01)
G01R 13/02 (2006.01)

(52) U.S. Cl.
CPC ............ *G01R 13/20* (2013.01); *G01R 13/029* (2013.01); *G01R 13/206* (2013.01)

(58) Field of Classification Search
CPC ..................................................... G01R 13/20
USPC .......................................................... 702/67
See application file for complete search history.

(56) References Cited

U.S. PATENT DOCUMENTS

| | | | |
|---|---|---|---|
| 5,361,776 A | 11/1994 | Samuelson et al. | |
| 6,163,758 A * | 12/2000 | Sullivan | G01R 13/0263 345/440.1 |
| 6,188,384 B1 * | 2/2001 | Sullivan | G01R 13/0263 345/440.1 |
| 6,333,732 B1 * | 12/2001 | Gerlach | G01R 13/345 345/440.1 |
| 6,928,374 B2 * | 8/2005 | Letts | 702/67 |
| 6,947,043 B1 * | 9/2005 | Klingman et al. | 345/440.1 |
| 2002/0180737 A1 * | 12/2002 | Letts | G01R 13/0263 345/440.1 |
| 2003/0208328 A1 | 11/2003 | Pickard | |
| 2003/0208330 A1 * | 11/2003 | Pickerd | 702/80 |
| 2003/0222873 A1 * | 12/2003 | Ritter | 345/440 |
| 2004/0102910 A1 * | 5/2004 | Letts | 702/67 |
| 2005/0131974 A1 * | 6/2005 | Letts | G06K 9/00496 708/300 |
| 2005/0234670 A1 * | 10/2005 | Hagen et al. | 702/85 |
| 2006/0212239 A1 * | 9/2006 | Letts | G01R 13/029 702/66 |
| 2008/0147342 A1 * | 6/2008 | Heuser et al. | 702/80 |
| 2009/0195536 A1 * | 8/2009 | Louise et al. | 345/419 |
| 2009/0228226 A1 * | 9/2009 | Dobyns et al. | 702/67 |

(Continued)

FOREIGN PATENT DOCUMENTS

WO  2005121814 A1  12/2005

OTHER PUBLICATIONS

European Search Report and Written Opinion for Application No. 13184405.2, dated Jan. 14, 2014, 7 pages.

*Primary Examiner* — Manuel L Barbee
*Assistant Examiner* — Raymond Nimox
(74) *Attorney, Agent, or Firm* — Michael A. Nelson; Marger Johnson

(57) ABSTRACT

Method and devices are described for visually detecting anomalies in non-repetitive signals. One device may take the form of an oscilloscope capable of displaying segments of a complete waveform record that includes non-periodic triggering events. The segments may be displayed vertically and horizontally offset from one another to aid in the visual detection of anomalies within the record. Decayed or aged segments of a waveform may also be simultaneously displayed.

17 Claims, 8 Drawing Sheets

(56) References Cited

U.S. PATENT DOCUMENTS

2009/0249363 A1* 10/2009 Dobyns et al. ............... 719/318
2009/0261814 A1* 10/2009 Dobyns et al. ........... 324/121 R

* cited by examiner

METHODS AND SYSTEMS FOR GENERATING DISPLAYS OF WAVEFORMS

BACKGROUND

It has been recognized that the ability to visually detect anomalies within electrical, communications and other similar signals is very helpful in the design, development, manufacture and troubleshooting of electrical, electronic and telecommunications circuitry, devices, systems and the like. U.S. Pat. No. 6,928,374 entitled Methods For Displaying Jitter And Other Anomalies In Long Acquisition Data Records ("'374 patent"), assigned to the same assignee as the present application, discusses various examples of methods and devices for visually detecting anomalies in mostly, so-called periodic waveforms. To enable the visual detection of an anomaly in very long data records (where a "record" is, for example, a stored representation of a waveform), the '374 patent provides embodiments that allow for the display of the record on a pulse-by-pulse basis (i.e., a single instance of the basic shape of a periodic waveform). More recently, non-periodic or less-repetitive waveforms (interchangeably referred to herein as "waveforms", "signals" or "signal") have been increasingly generated by electronic and communication devices.

Accordingly, there is a need for methods and related systems for visually detecting anomalies in less repetitive signals, among other needs. Yet further, there is a need to more easily, visually detect anomalies within a waveform record.

SUMMARY

In accordance with embodiments of the present invention, there are provided methods and related systems for displaying triggered waveform record event segments. One exemplary method comprises: displaying a first waveform record segment comprising a first non-periodic triggering event; and displaying a next waveform record segment, comprising a next non-periodic triggering event aligned on a time axis with the first event and separated from the first event by a variable, elapsed time period, offset vertically and horizontally from the first waveform record segment. This exemplary method may further comprise: identifying the first event from a first stored waveform record that comprises a plurality of triggering events; generating first image data representing the first waveform record segment that includes the identified first event; identifying the next event from the first stored waveform record, the next event separated from the first event by the variable, elapsed time period; and generating next image data representing the next waveform record segment that includes the identified next event.

A further exemplary method may comprise: displaying the first waveform record segment on a first display portion based on the first image data and simultaneously displaying the next waveform record segment on a next display portion, where the next display portion may be offset vertically and horizontally from the first display portion and such that the next event is aligned on the time axis with the first event, based on the next image data.

The exemplary methods above may be implemented using an exemplary system, such as an oscilloscope, that comprises a program memory for storing executable instructions, and a processor operable to access and execute the instructions stored within the memory for completing exemplary functions that parallel the exemplary steps in the methods above. Such an exemplary system may further comprise a display for displaying the first and next waveform record segments, and/or a user interface for activating and controlling visual detection of anomalies in waveform record segments, the interface comprising a plurality of control keys, at least one key for controlling spacing between non-periodic triggering events.

In accordance with additional embodiments of the present invention, there are provided methods and related systems for displaying segments of a waveform. One such exemplary method comprises: displaying a first decayed segment of a waveform having a first variable image; and simultaneously displaying a next decayed segment of the waveform, having a second variable image that differs from the first variable image, vertically and horizontally offset from the first decayed segment. In further embodiments the first and next segments may be derived from a non-periodic waveform record. Still further, additional embodiments may comprise varying an image intensity of the first and next variable images, and varying an image size of the first and next variable images.

A further exemplary method may comprise: displaying the first and next segments such that a non-periodic triggering event within each segment is aligned on a same time axis and each non-periodic triggering event is separated by a variable, elapsed time period.

As with the earlier mentioned exemplary methods, the above mentioned exemplary methods may also be implemented using an exemplary system, such as an oscilloscope, that comprises a program memory for storing executable instructions, and a processor operable to access and execute the instructions stored within the memory for completing exemplary functions that parallel the exemplary steps in the methods above. Such an exemplary system may further comprise a display for displaying the first and next decayed segments. Additional aspects and advantages of the present invention will become apparent during the course of the following discussion and by reference to the accompanying drawings.

BRIEF DESCRIPTION OF THE DRAWINGS

Referring now to the drawings.

DETAILED DESCRIPTION, WITH EXAMPLES

Recently, there has been identified instances where less repetitive signals are continuously sampled, but only those segments that contain so-called non-periodic "triggering events" are recorded (i.e., saved in memory). Some non-limiting examples are specific packet headers in serial data, and signals from randomly switching power supplies. To appropriately detect anomalies in such a signal requires the display of a complete record of the triggering events. Accordingly, the present inventor discovered methods and systems for displaying the complete record of non-periodic triggering events.

Prior to describing the details of embodiments of the inventive methodologies, an embodiment of a related system that may be used to implement such methodologies will be briefly described.

Figure 1:
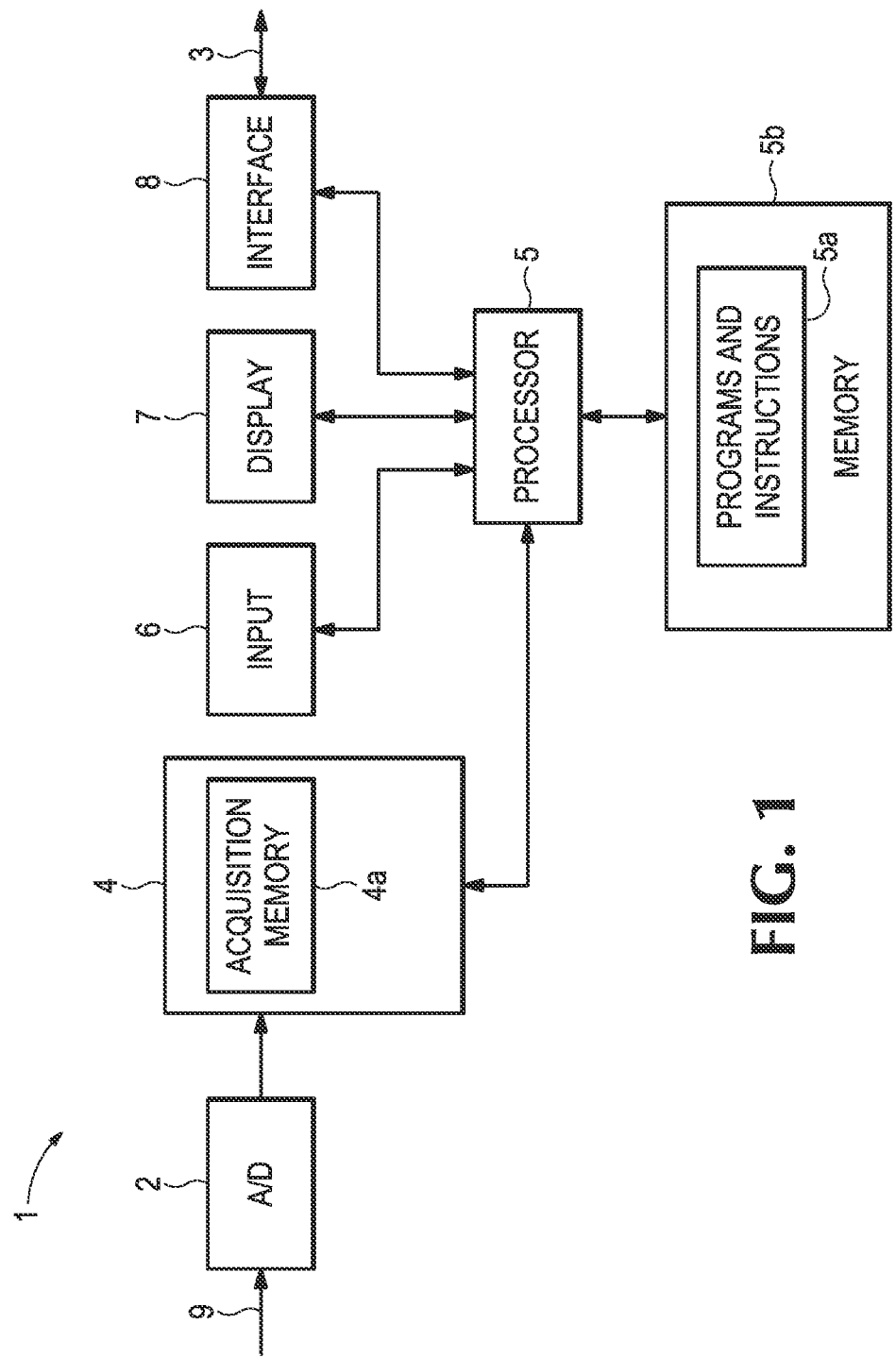
FIG. 1 depicts a block diagram of a system for displaying a complete record of non-periodic triggering events of a signal according to one embodiment of the present invention.

Referring now to FIG. 1, there is shown a block diagram of a system 1 for displaying a complete record of non-periodic triggering events of a signal and/or displaying decayed waveforms according to embodiments of the present invention. One example of such a system is a digital phosphor oscilloscope or "DPO". That said, it should be understood that other test and measurement systems/devices or analytical systems/devices may be used as well. The description below will focus on those features of a system that are related to the present invention. Conversely, details concerning the traditional operation of a DPO or the like, such as how a DPO samples a signal and stores it in memory, for example, are not discussed in great detail.

As depicted in FIG. 1, the system 1 may, for example, comprise an analog to digital (A/D) converter 2, acquisition section 4, processor 5, input section 6, display section 7 and interface section 8. The A/D converter 2 may be operable to receive and digitize one or more waveforms or signals via input pathway 9 from an electronic or communications device or the like, in response to a clock signal produced by a known clock source (not shown). Though not shown in FIG. 1, it should be understood that system 1, and in particular pathway 9, may comprise one, two, four, or any number of channels that are input via A/D converter 2, suitable for use with various embodiments as described herein, to receive a signal. A digitized representation of an input signal generated by the A/D converter 2 may be stored as digitized, acquired data in acquisition memory 4a of the acquisition section 4. In order to allow for further processing and/or analyses by the processor 5, the acquisition section 4 may be operable to communicate with the processor 5.

The processor 5 may be operable to access executable instructions 5b stored in associated program memory 5a to manage the various operations of the system 1 and to perform various functions, including processing and analyzing the data samples stored within the acquisition memory 4a. The processor 5 may be implemented as, for example: one or more programmable digital signal processors, programmable microprocessors, such as those designed and developed by Intel Corporation; or multiple programmable controllers. In yet another embodiment, when the processor 5 is implemented using multiple processors, one processor may be used to control the acquisition and processing of input signals while the second may control the other operations of the system 1. The system 1 may be further controlled using a Windows® Operating System, such as Windows XP®, designed and developed by Microsoft Corporation that is stored, for example, within program memory 5a and accessed, for example, by the processor 5.

The acquisition memory 4a and program memory 5a may comprise any suitable recordable medium or storage medium capable of storing the acquired data, including one or more records, and/or executable instructions and programs that can be accessed and executed by the processor 5. For example, memories 4a, 5a may take the form of RAM, ROM and/or cache memory. RAM memory may be operable to store volatile data, such as acquired data and corresponding data patterns. Though the acquisition memory 4a and program memory 5a are depicted as two separate memories, it should be understood that these memories can be combined into one or further broken down into additional memories. Alternatively, acquired data and/or executable instructions may be stored in a recordable medium separate from memories 4a, 5a that may be accessed by the processor 5 via interface section 8 and interface pathway 3. Such a medium may comprise external or internal mass storage media of a mass storage unit.

The processor 5 may be operable to receive commands via an input section 6, such as a keypad, pointing device or touch screen, for example. Among its functions, the processor 5 may be operable to provide data to display section 7 to display a waveform, in particular segments of a waveform record. The display section 7 may comprise a cathode ray tube (CRT), liquid crystal display (LCD) or other display device. The processor 5 may be further operable to communicate with additional devices via interface pathway 3, which may comprise a general purpose interface bus (GPIB), Internet protocol (IP) link, Ethernet link, Universal Serial Bus (USB), next generation USB or faster interfaces, proprietary link or other communications pathway via the interface section 8. In the case where processor 5 communicates with a smart phone or tablet or another device that includes a display, the processor 5 may be further operable to appropriately format and provide data to such a device for display, and, yet further, receive commands and data from such a device to analyze or display, for example, acquired data. While components of system 1 are shown to be directly coupled to each other, it should be understood that system 1 may include a variety of other circuitry or software components which are not necessarily shown, but that are disposed between, or otherwise associated with, the illustrated components of system 1. Such circuitry may include power supplies, clock circuits, cache memory, input/output (I/O) circuitry and the like, as well as specialized circuits that may be used in conjunction with the processor 5 to complete functions in accordance with executable instructions and programs stored in memory 5a. The I/O circuitry may be used to form interfaces between the various elements shown communicating with, or connected to, the processor 5.

In yet another embodiment, rather than make use of processor 5 and memory 5a the system 1 may comprise one or more application specific integrated circuits (ASICs).

Figure 2:
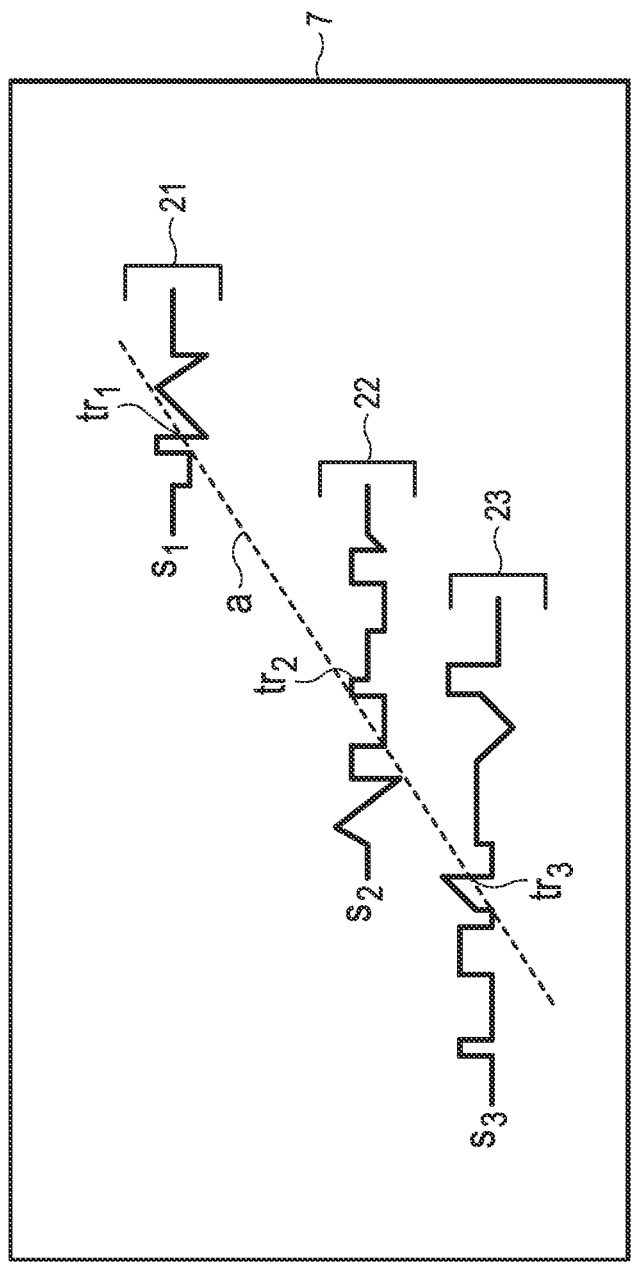
FIG. 2 depicts exemplary waveform record segments as viewed on a display according to one embodiment of the present invention.

Referring now to FIG. 2 there is depicted exemplary waveform record segments $s_1$ through $s_3$ as viewed on display section 7. For ease of understanding, in one embodiment of the invention the display section 7 may comprise one or more portions 21-23, referred to as a first display portion 21, second display portion 22 and third display portion 23. The second and third display portions may also be referred to as a "next" display portion (i.e., the second portion is the next one after the first portion while the third portion is the next one after the second portion). Though three segments $s_1$ through $s_3$ and three portions 21-23 are depicted in FIG. 2 it should be understood that as little as one segment or portion may be depicted on the display section 7 or more than three segments or portions may be depicted. Three segments and portions are discussed herein simply for ease of explaining features of the present invention. The display section 7 may further comprise one or more integrated user interfaces, such as soft keys or pushbuttons. For the sake of clarity these elements are not shown in FIG. 2, and are discussed later with respect to FIG. 4.

In the embodiment shown in FIG. 2, each of the waveform record segments $s_1$ through $s_3$ typically includes a number of different shapes of a non-periodic waveform that spans a number of pulse widths and includes at least one triggering event labeled $tr_1$, $tr_2$ and $tr_3$, respectively. In an embodiment of the invention, each of the triggering events $tr_1$, $tr_2$ and $tr_3$ is a non-periodic triggering event. That is, the time that elapses between triggering event $tr_1$ to $tr_2$ is not necessarily the same as the time that elapses between triggering event $tr_2$ and $tr_3$. As can be seen in FIG. 2, each of the triggering events $tr_1$, $tr_2$ and $tr_3$ are further depicted on the display section 7 as being aligned on a time axis a. Further, each of the segments $s_1$ through $s_3$ is depicted as being displayed in a position that is offset vertically and horizontally from one another.

Because the segments $s_1$ through $s_3$ are offset and the non-periodic triggering events are aligned as shown in FIG. 2, a user of system 1 may be able to quickly, visually determine whether an anomaly or anomalies have occurred within a segment of a waveform record that includes a non-periodic triggering event. As used herein, the term "anomaly" refers to jitter, a glitch, an unexpected change in shape, a bump, a discontinuity, other deviations from an expected waveform.

In accordance with an embodiment of the present invention the system 1 may be operable to display a first waveform record segment (e.g., $s_1$) comprising a first non-periodic triggering event (e.g., $tr_1$), and display a next waveform record segment (e.g., $s_2$ or $s_3$), comprising a next non-periodic triggering event (e.g., $tr_2$ or $tr_3$) aligned on a time axis (e.g., a) with the first triggering event, and separated from the first event by a variable, elapsed time period, where the each segment is displayed as being offset vertically and horizontally from each other segment.

Figure 3:
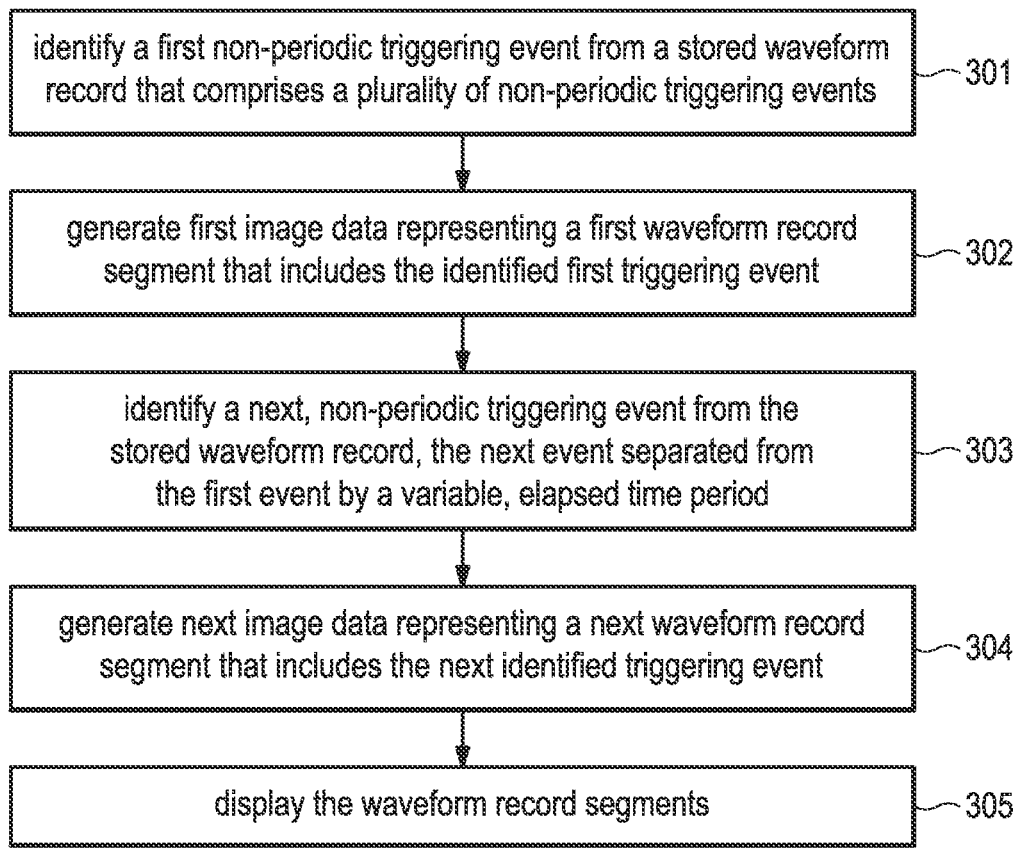
FIG. 3 depicts a flow diagram of an exemplary process that may be completed by an exemplary system in order to display waveform record segments in accordance with embodiments of the present invention.

FIG. 3 depicts a flow diagram of an exemplary process that may be completed by the system 1 (e.g., processor 5 operable to access and execute instructions stored within memory 5a that may be part of an executable program 5b stored within memory 5a) in order to display the waveform record segments $s_1$ through $s_3$ as shown in FIG. 2 on portions 21-23 of display section 7. In order to display segments $s_1$ through $s_3$ the system 1 may be operable to identify a first non-periodic triggering event, such as $tr_1$, from a stored waveform record that comprises a plurality of non-periodic triggering events, and which may be stored within acquisition memory 4a for example, at step 301. The entire waveform record of a signal input into and stored by system 1 may comprise millions of data points (e.g., 10 million), each point representing a voltage value of a substantially non-repetitive signal. Within this record there may be very few or a large number of non-periodic triggering events depending on the type of device or channel being tested and the condition of such a device/channel. To identify the first triggering event $tr_1$ the processor 5 may be operable to access and execute instructions stored within memory 5a that are a part of an executable program 5b stored within memory 5a. Alternatively, the identification of the first and subsequent next non-periodic triggering events may be completed by one or more ASICs. In either case, after identifying the first non-periodic triggering event the system 1 may be further operable to generate first image data representing the first waveform record segment $s_1$ that includes the identified first triggering event $tr_1$, for example, in step 302. In particular, in order to generate the image data the processor 5 may be operable to access and execute instructions stored within memory 5a that are a part of an executable program 5b for converting acquired data stored within memory 4a representative of segment $s_1$ into image data. Alternatively, the conversion may be completed by one or more ASICs.

In a similar fashion, each segment of the stored waveform record corresponding to a signal input via pathway 9 that contains a non-periodic triggering event may be identified and image data generated. In accordance with the present invention, because the waveform record (from which $s_1$ through $s_3$ segments are identified) contains data representing, and associated with, non-periodic triggering events the next non-periodic triggering event may be separated from the first event by a variable, elapsed time period, not a fixed time period. In general, each non-periodic triggering event $tr_1$ through $tr_M$, where M is the last triggering event, may be separated from another triggering event by a variable, elapsed time period, not a fixed time period.

In more detail, in one embodiment of the invention the system 1 may be operable to identify a next, non-periodic triggering event (e.g., $tr_2$ or $tr_3$) from the stored waveform record using processor 5, instructions 5b within memory 5a and/or one or more ASICs as before, in step 303, the next event separated from the first event by a variable, elapsed time period. Once the next non-periodic triggering event is identified, the processor 5 may be further operable to generate next image data representing the next waveform record segment (e.g., $s_2$ or $s_3$) that includes the next identified triggering event, in step 304. In particular, in order to generate the image data the processor 5 may be operable to access and execute instructions that are a part of an executable program 5b stored within memory 5a. Alternatively, the system may use one or more ASICs.

Once the system 1 has generated image data representing waveform record segments that include identified non-periodic triggering events, the system may use this image data to display the waveform record segments as shown in FIG. 2, in step 305. In more detail, the system 1 may be operable to display the first waveform record segment $s_1$ on the first display portion 21 based on the first image data and simultaneously display the next waveform record segment or segments ($s_2$ and/or $s_3$) on a next display portion or portions 22, 23 based on the next image data. Further, the system 1 may be operable to: (i) display a next waveform record segment ($s_2$ and/or $s_3$) on a next display portion (22 and/or 23) that is offset vertically and horizontally from the first display portion 21; and (ii) display the next waveform record segment ($s_2$ and/or $s_3$) on the next display portion (22 and/or 23) such that the next triggering event ($tr_2$ or $tr_1$) is aligned on the time axis a with the first triggering event, $tr_1$. The simultaneous display of offset waveform record segments allows a user to quickly, visually identify anomalies within a segment of a record. Though FIG. 2 depicts the simultaneous display of segments $s_1$ through $s_3$ in display portions 21-23, in an alternative embodiment of the invention fewer than all of the segments $s_1$ through $s_3$ may be displayed simultaneously (e.g., some may be displayed separately).

In one embodiment the system 1 utilizes the processor 5 and stored instructions 5b in memory 5a, for example, to complete the display of the waveform record segments $s_1$ through $s_3$ shown in FIG. 2. As described further below, these instructions may comprise a mapping function for mapping image data to portions of the display section 7. Alternatively, the system may use one or more ASICs.

To display the waveform record segments $s_1$ through $s_3$ simultaneously, in one embodiment of the invention the display section 7 may comprise a high-speed rasterizer that is operable to communicate with the processor 5 or ASICs. When system 1 comprises another type of oscilloscope other than a DPO, the rasterizer allows the system 1 to simulate effects of a DPO.

Figure 4:
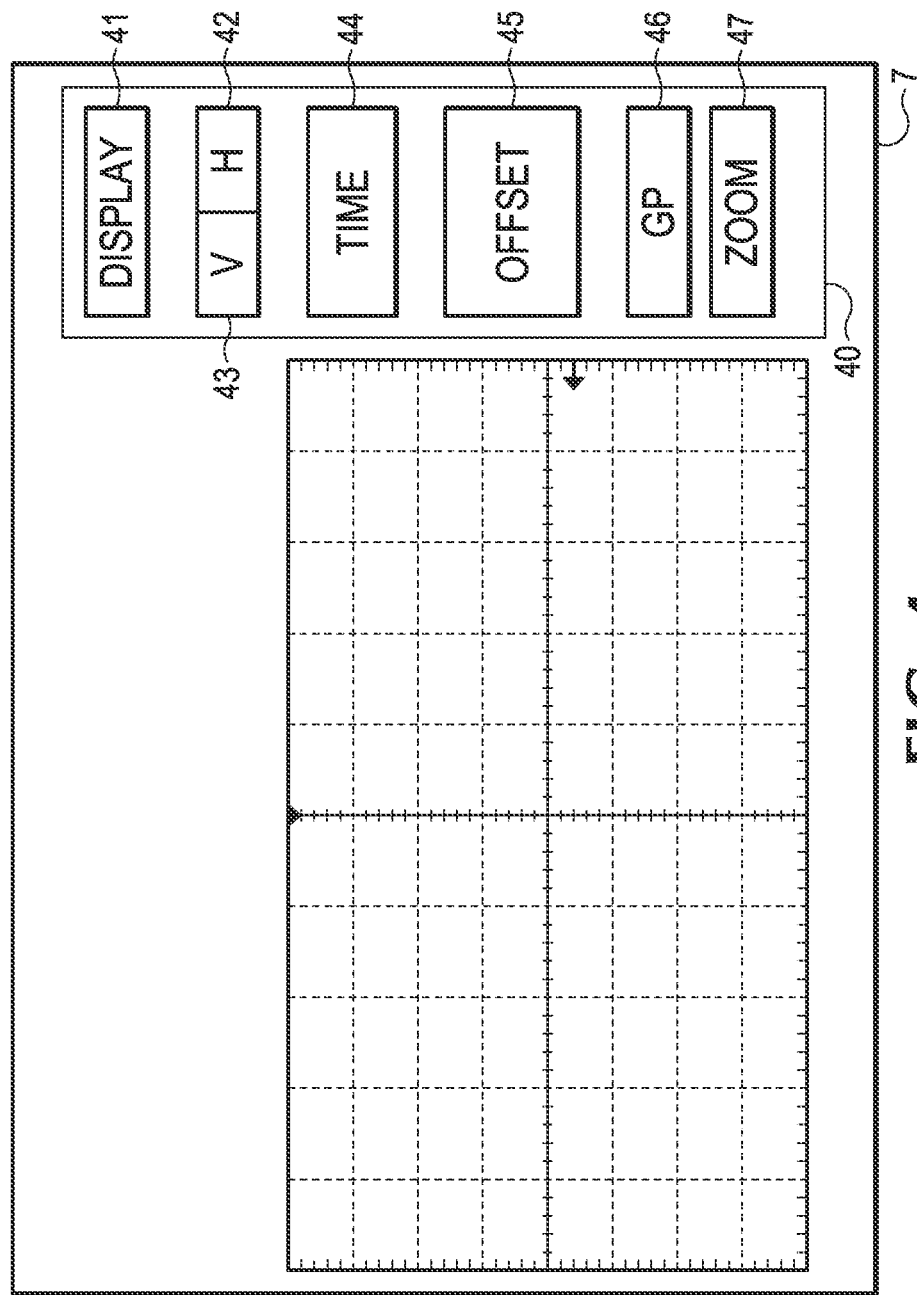
FIG. 4 depicts a user interface that may be part of an exemplary system for activating and controlling the visual detection of anomalies in non-repetitive signals according to an embodiment of the present invention.

Referring now to FIG. 4 there is depicted a user interface 40 that may be part of the system 1, in particular part of display section 7 for activating and controlling the visual detection of anomalies in waveform record segments, for example. When the user interface 40 is a part of the display section 7, in one embodiment of the invention the display section 7 may be operable to display the user interface 40 as comprising a a plurality of control keys 41-47. In one embodiment, the control keys 41-47 are so-called soft keys. As depicted in the embodiment shown in FIG. 4, the interface 40 may comprise a user interface display portion 41, a horizontal position control key 42 for moving a trigger position of a segment left or right on the display section 7, vertical position control key 43 for moving a segment up or down on the display section 7, at least one time scale control key 44 for controlling the displayed spacing between triggering events along an inclined, time axis a while maintaining the relative position of the events, and at least one offset control key 45 for controlling the angle of the axis a. Additional keys may include a general purpose (GP) key 46 that functions as an event selector and a zoom key 47 for visually examining a displayed segment in more detail. In an alternative embodiment of the invention, the soft keys 41-47 may be selected using a "mouse-like" device via interface section 8. It should be understood that the positioning of the keys 41-47 is only for illustrative purposes and that their position may be altered without changing their function or the scope of the invention. Further, though shown as seven separate keys, one or more of the keys 41-47 may be combined into fewer keys or may be further separated into additional keys. Though soft keys have been described as the control keys in the interface 40, it should be understood that any number of other devices may be used, such as knobs and push keys, control buttons, pull-down menus or the like, or any other suitable means that can be used in conjunction with the embodiments described herein. The interface 40 may be used in conjunction with the embodiments depicted in FIGS. 1-3 described above as well as in FIGS. 5-8 described below.

Figure 5:
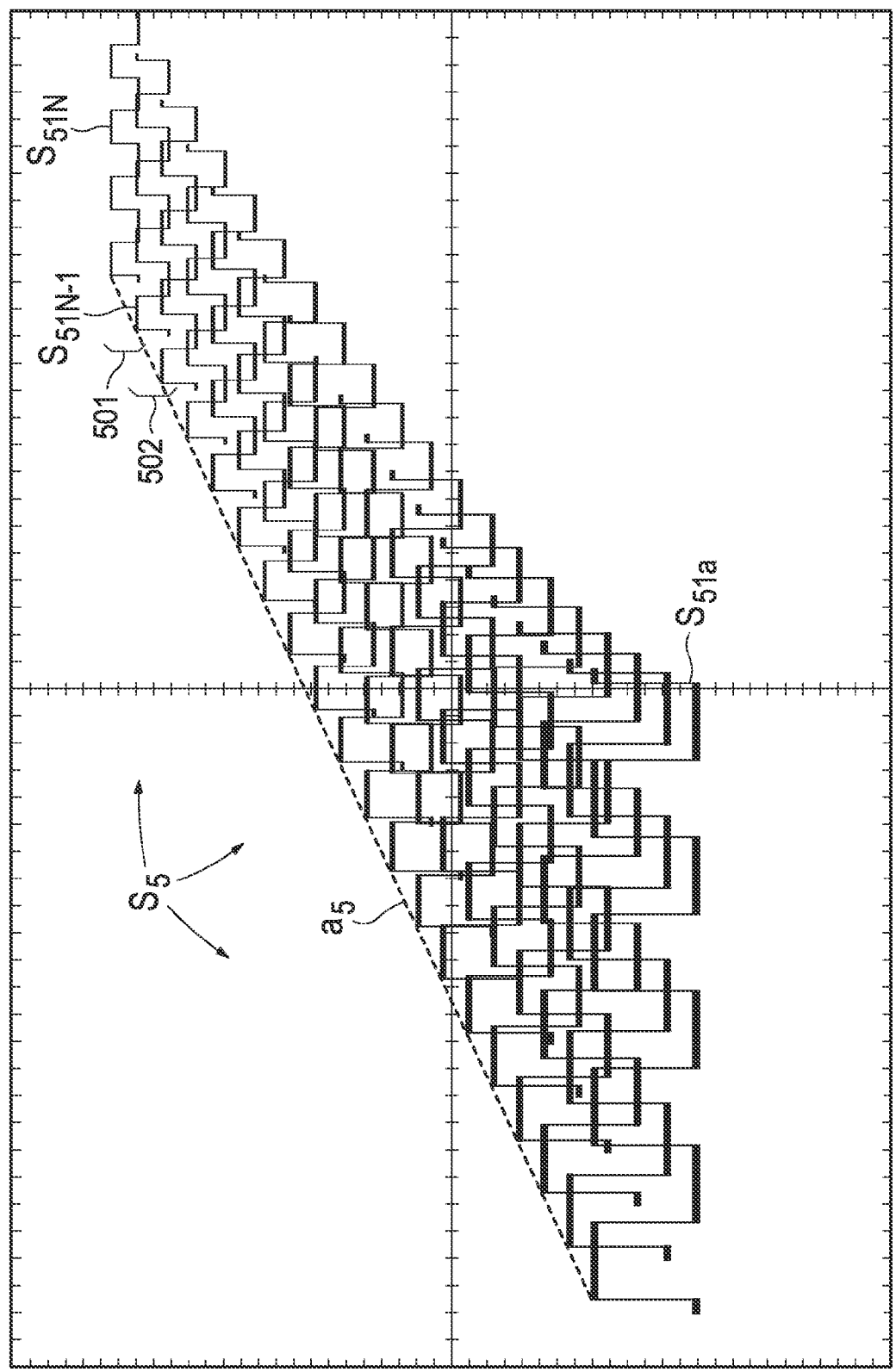
FIG. 5 depicts a "decaying" waveform according to an embodiment of the present invention.

The embodiments described above have focused mostly on creating displays of non-periodic waveforms. Additional embodiments focus on the display of either periodic or non-periodic waveforms. Referring now to FIG. 5 there is depicted a "decaying" waveform $s_5$ according to an embodiment of the present invention. As depicted in FIG. 5, the waveform $s_5$ consists of a number of decayed or decaying (used synonymously herein) segments $s_{51a}$ through $s_{51N}$, where "N" represents the segment at one end of a sequence of segments $s_{51a}$ through $s_{51N}$, and where each segment $s_{51a}$ through $s_{51N}$ is depicted as being offset horizontally and/or vertically from one another such that the decayed segments appear to move away from the viewer from the bottom of the display section 7 towards the top of the display section 7, for example. Though the waveform $s_5$ depicted in FIG. 5 is a square-wave, it should be understood that this is for illustration only, and that in embodiments of the invention the waveform $s_5$ may comprise a non-repetitive waveform. Further, while FIG. 2 depicts static segments $s_1$ through $s_3$ of a large waveform record, in one embodiment of the invention, FIG. 5 depicts segments $s_{51a}$ through $s_{51N}$ of waveform $s_5$ that are dynamic, not static, in that their images (e.g., offset position(s), size, intensity) may be constantly updated. It should be understood, however, that the images of segments in the embodiments shown in FIGS. 2 and 5 could be either statically or dynamically displayed.

To provide the segments $s_{51a}$ through $s_{51N}$ with a "decayed" look a variable image of each segment may differ from one segment to another. For example, the intensity and/or size of the variable images of segments $s_{51a}$ through $s_{51N}$ may be different. The variable image of segment $s_{51a}$ may be the most intense and/or be the largest in size while the variable image of segment $s_{51N}$ may be the least intense and/or smallest in size, with the degree of intensity and/or size for each variable image of each segment in between decayed segments $s_{51a}$ and $s_{51N}$ differing from every other segment. In such an embodiment the variable image of a segment displayed with the most intensity and/or largest size may represent the most recently decayed segment ("newest" segment), while the variable image of a segment displayed with the least intensity and/or smallest size may represent an older decayed segment that had been previously displayed ("oldest" segment).

In an alternative embodiment of the invention the segments $s_{51a}$ through $s_{51N}$ may be depicted as being displayed such that triggering events within each segment are all aligned on the same time axis, $a_5$. In the case of the waveform shown in FIG. 5, the triggering events may correspond to the beginning of each segment $s_{51a}$ through $s_{51N}$.

Figure 6:
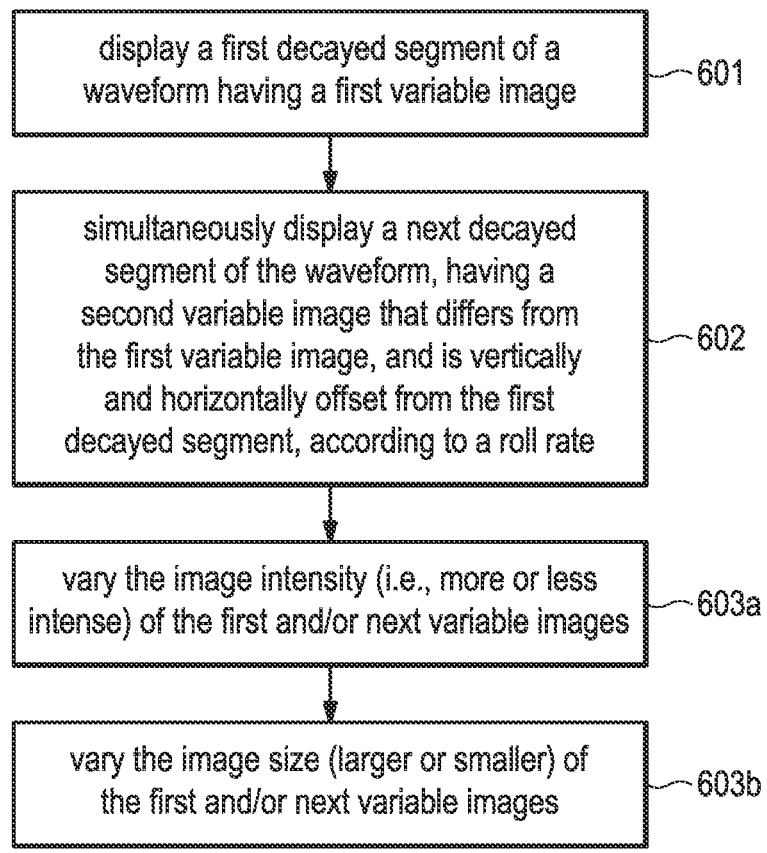
FIG. 6 depicts a flow diagram of an exemplary process that may be completed by an exemplary system in order to display a decaying waveform according to an embodiment of the present invention.
Figure 7:
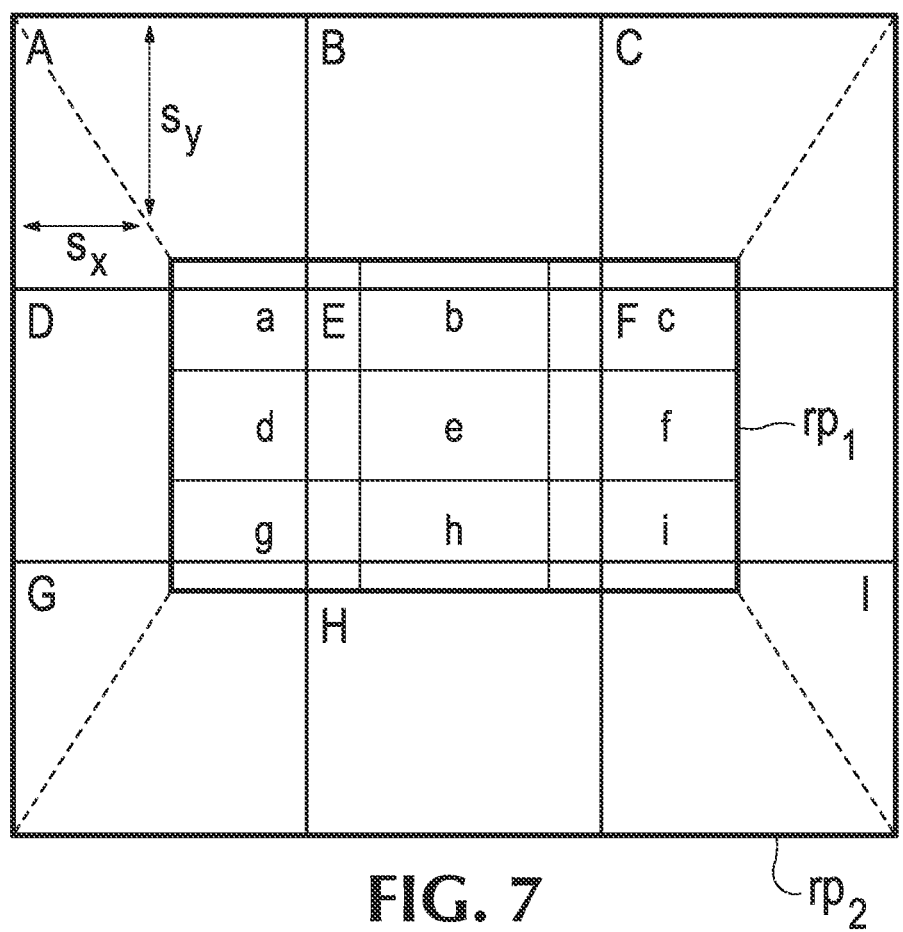
FIG. 7 depicts exemplary rasterizing planes according to an embodiment of the present invention.
Figure 8:
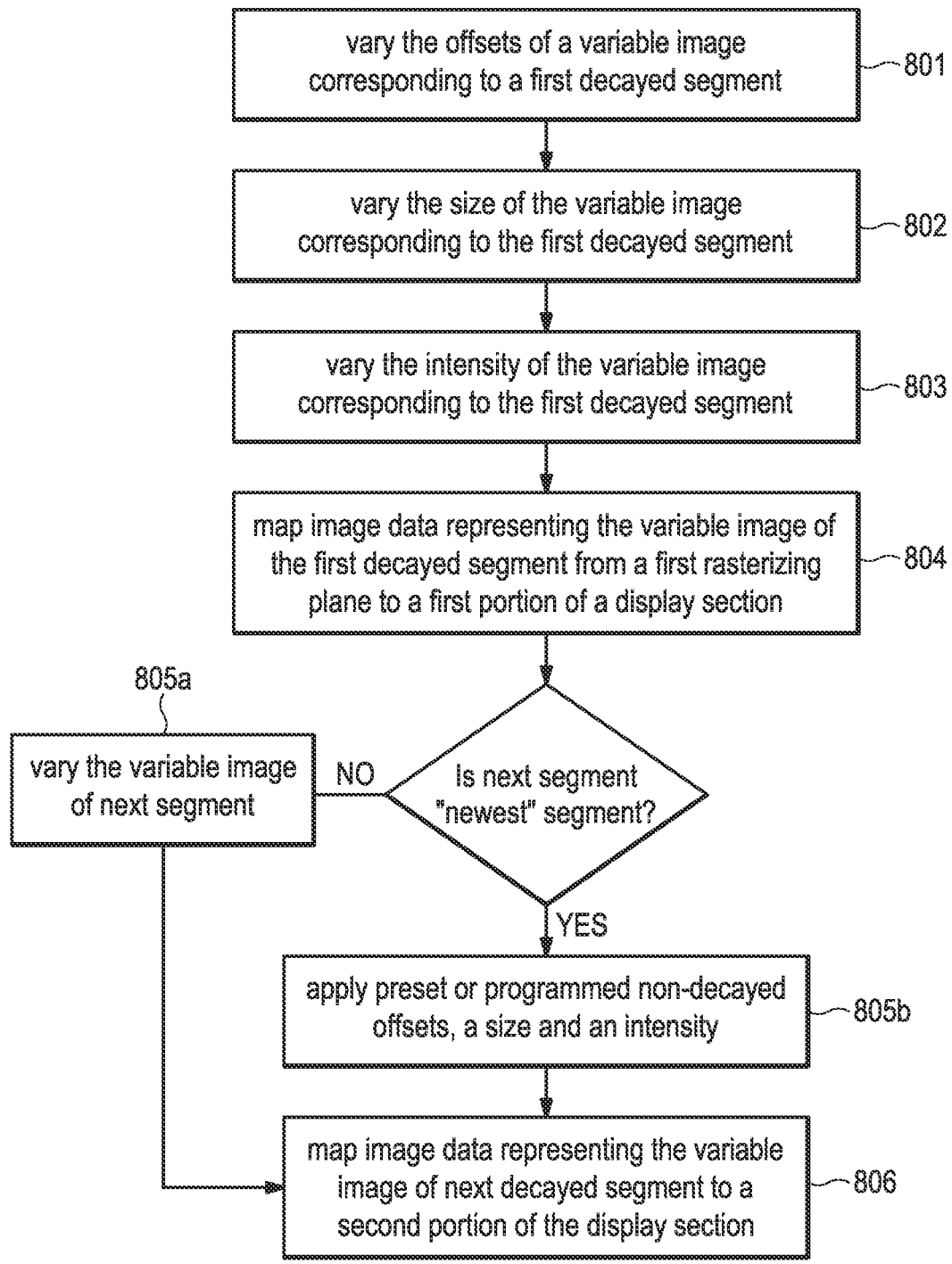
FIG. 8 depicts a flow diagram of an exemplary process that may be completed by an exemplary system in order to map image data from one or more rasterizing planes to one or more display portions of an exemplary display according to an embodiment of the present invention.

FIG. 6 depicts a flow diagram of an exemplary process that may be completed by the system 1 in order to display the decayed waveform $s_5$ shown in FIG. 5. The system 1 may be operable to display a first decayed segment (e.g., $s_{51N}$) of a waveform having a first variable image, in step 601 and simultaneously display a next decayed segment (e.g., $s_{51N-1}$) of the waveform, having a second variable image that differs from the first variable image, and is vertically and horizontally offset from the first decayed segment, according to a roll rate, (e.g., a time scale factor for determining the relative positions of segments along a time axis), in step 602. In general, to display each of the segments the system 1 may be operable to simultaneously display a given segment as a variable image that differs from a variable image of every other segment, and which is vertically and horizontally offset from every other segment. In accordance with embodiments of the invention, the system 1 may be operable to vary the image intensity (i.e., more or less intense) of the first and/or next variable images in step 603a or, alternatively vary the image size of the first and/or next variable images (larger or smaller) in step 603b. In general, the system 1 may be operable to vary the image intensity and/or size of each variable image associated with each of the segments $s_{51a}$ through $s_{51N}$, and offset such images vertically and horizontally, such that each segment's image appears, and is displayed, differently from every other image, for example.

As indicated above, though the waveform $s_5$ is depicted as a square-wave this is only for illustrative purposes. In a further embodiment the first and next (and each) segment may be derived from a non-periodic waveform record. In the case where the waveform contains non-periodic triggering events, the system 1 may be further operable to display first and next decayed segments of such a waveform such that each non-periodic triggering event within each decayed segment (e.g., one per segment) is aligned on a same time axis, where the non-periodic triggering events are separated by variable, elapsed time periods.

To implement the processes discussed above, the processor $5$ may be operable to access and execute instructions $5b$ stored in associated program memory $5a$. For example, the processor $5$ may access executable instructions $5b$ for continuously displaying decayed segments $s_{51a}$ through $s_{51N}$ (e.g., displaying $s_{51N}$ first and $s_{51a}$ last, or vice-versa). Yet further, the processor $5$ may be operable to continuously forward image data representing the variable images of segments $s_{51a}$ to $s_{51N}$ to a rasterized display section $7$ at an acceptable update rate. Still further, the processor $5$ may be operable to access and execute instructions $5b$ stored in associated program memory $5a$ for "mapping" image data representing the variable images of decayed segments from one or more rasterizing planes to one or more display portions of the display section $7$, as discussed further below.

In one embodiment of the invention, to display decayed segments $s_{51a}$ through $s_{51N}$, the system $1$ (e.g., processor $5$) may be operable to "map" image data corresponding to a variable image of segment $s_{51a}$ through $s_{51N}$, that resides in, or corresponds to, "cells" of particular rasterizing planes within memory $4a$ and/or $5a$, to particular pixels that make up one or more portions of display section $7$. Referring to FIG. $7$, there is shown a depiction of exemplary rasterizing planes $rp_1$ and $rp_2$, respectively. In one embodiment planes $rp_1$ and $rp_2$ are part of memory $4a$ and/or $5a$. In more detail, memory $4a$ and/or $5a$ may comprise a database of image data, where the database is divided into information cells or sections. Each cell may have a unique position (i.e., co-ordinates) within the database that identifies the location of specific image data. Each cell, in turn, may correspond (i.e., "map") to the location of a particular pixel in a display, such as display section $7$, which also has co-ordinates. Together, a group of cells may form a rasterizing plane. The first rasterizing plane $rp_1$ shown in FIG. $7$ consists of cells a through i that may contain image data representing the variable image of segment $s_{51N}$ while the second rasterizing plane $rp_2$ consists of cells A through I that may contain image data representing the variable image of segment $s_{51N-1}$, for example. It should be understood that although planes $rp_1$ and $rp_2$ are shown as if they were created together, this is usually not the case. Instead plane $rp_1$ may typically be generated first, it representing the variable image of older decayed segment $s_{51N}$ that in one embodiment of the invention may be less intense and smaller than the variable image of "newer" decayed segment $s_{51N-1}$. Because the co-ordinates of image data (i.e., location) and type of image data (e.g., intensity, size) corresponding to rasterizing planes $rp_1$ and $rp_2$ may be different the variable images of segments $s_{51N}$ and $s_{51N-1}$ may differ, (e.g., may be displayed at different locations within display section $7$, with different sizes and/or intensities). Though two rasterizing planes are depicted in FIG. $7$ it should be understood that this is just for ease of explanation and understanding. In one embodiment of the invention, each variable image of a newer waveform segment is displayed on top of a previously displayed variable image of an older waveform segment after the variable image of the older waveform segment has been "decayed" (i.e., varied). In an embodiment of the invention, to "decay" or vary a particular variable image of a particular waveform segment the processor $5$ may be operable to access and execute instructions $5b$ stored in associated program memory $5a$ for: (a) reducing the size of a variable image, and/or (b) reducing the intensity of the variable image, and/or (c) applying vertical and horizontal offsets to the variable image. Once a given variable image has been varied or decayed, the processor $5$ may be further operable to access and execute instructions $5b$ stored in associated program memory $5a$ for mapping image data corresponding to the variable image of the so decayed waveform segment to a portion of display section $7$ before a newer waveform is displayed or drawn on top of the so displayed waveform.

FIG. $8$ depicts a flow diagram of an exemplary process that may be completed by the system $1$ in order to map image data to one or more display portions of the display section $7$ (e.g., portions $501$, $502$ in FIG. $5$).

To illustrate an embodiment of the invention, assume that only two waveform segments are desired to be drawn or displayed, namely segments $s_{51N}$ and $s_{51N-1}$. For purposes of the exemplary embodiment, further assume that waveform segment $s_{51N}$ may be displayed before segment $s_{51N-1}$. Again, for ease of explanation we refer to this segment as a "first" decayed segment and segment $s_{51N-1}$ as a next decayed segment. In accordance with an embodiment of the present invention, system $1$ may be operable to map image data corresponding to variable images of segments $s_{51N}$ and $s_{51N-1}$ to portions of a display section as follows. In accordance with preset and/or programmable vertical and horizontal offsets, the offset of the variable image corresponding to the first decayed segment may be varied, in step $801$. In the example depicted in FIG. $5$, the variable image corresponding to first decayed segment $s_{51N}$ is offset vertically upwards and horizontally to the right with respect to segment $s_{51N-1}$ (and each other segment as well), though it may also have been offset in another direction(s). Next (or previous to step $801$), in accordance with preset and/or programmable sizes, the size of the variable image corresponding to the first decayed segment may be varied, in step $802$. In the example depicted in FIG. $5$, the variable image corresponding to first decayed segment $s_{51N}$ is reduced in size, though it may also be increased in size. Yet further (or previous to steps $801$, $802$), the intensity of the variable image corresponding to the first decayed segment $s_{51N}$ may be varied according to preset or programmable intensity levels, in step $803$. In the example depicted in FIG. $5$, the intensity of the variable image corresponding to first decayed segment $s_{51N}$ is reduced (made less intense), though it may also have been increased. The resulting changes to the variable image associated with the first decayed segment are represented as image data comprising first rasterizing plane $rp_1$. Thereafter, the image data representing the variable image of first decayed segment $s_{51N}$ from plane $rp_1$ may be mapped to a first portion $501$ of the display section $7$, in step $804$, in order to display segment $s_{51N}$. It should be understood that in varying each variable image, the horizontal and vertical offsets, sizes and intensity levels of each variable image are selected such that each variable image, and therefore each decayed segment $s_{51a}$ through $s_{51N}$, differs from one another.

Continuing with the example above, assuming that segment $s_{51N-1}$ is the next waveform segment to be displayed and image data corresponding to its variable image may be represented by plane $rp_2$, in accordance with an embodiment of the present invention, system $1$ may be operable to follow a similar process as in steps $801$ to $803$ to, if necessary, vary (decay) the variable image of segment $s_{51N-1}$, in step $805a$. If segment $s_{51N-1}$ is the newest segment, however, then the system $1$ may be operable to simply apply preset or programmed non-decayed offsets, a size and an intensity (e.g., no offsets, a largest size and most intense image) to the variable image associated with segment $s_{51N-1}$, in step $805b$.

In either case, after applying some type of offsets, a size and an intensity to the variable image associated with segment $s_{51N-1}$, the image data representing the variable image of next decayed segment $s_{51N-1}$ may be mapped to a second portion 502 of the display section 7, in step 806, in order to display segment $s_{51N-1}$ such that it appears to be "drawn on top of" (i.e., overlaps) first decayed image segment $s_{51N}$.

Similar processes may be used to display variable images of segments $s_1$ through $s_3$ in FIG. 2.

In an embodiment of the invention, rasterizing plane $rp_2$ may be derived from rasterizing plane $rp_1$ (by processor 5, instructions 5b, for example) as follows. Let $x_{aE}$ be the fraction of reduced input raster pixel 'a' that overlaps normal output raster pixel 'E' in the x (horizontal) direction and $y_{aE}$ be the similar fraction in the y (vertical direction). Further, similar fractional amounts, $x_{jE}$ and $y_{jE}$, may be defined for each reduced input raster pixel T that overlaps normal output raster pixel E. Let a, b, . . . represent the intensities of input raster pixels a, b, . . . , $S_x$ and $S_y$ be the spatial reduction factors in the x and y directions respectively, and $\delta$ be the intensity decay factor.

Then, the intensity E of output raster pixel E may be given by:

$$E = S_x \cdot S_y \cdot \delta \cdot (x_{aE} \cdot y_{aE} a + x_{bE} \cdot Y_{bE} b + \ldots),$$

where a summation is performed for all input raster pixels a, b, . . . , that overlap output pixel E. It should be noted that accumulated intensities are reduced by the spatial reduction factors to maintain the same overall intensity (in the absence of decay).

Although particular embodiments of the invention have been described, it will be appreciated that the principles of the present invention are not limited to these embodiments. For example, there are numerous, additional processes (too numerous to provide a complete listing herein) which may be used to vary the variable image of one segment so that the segment is distinguishable from another segment. These additional processes, as well as other variations and modifications to other features and functions of the embodiments discussed herein may be made without departing from the principles, spirit and scope of the invention as set forth in the following claims.

I claim:

1. A method for displaying, on a digital oscilloscope, triggered waveform records or triggered waveform segments of a single record along a sequence of primary waveform timelines that are offset along a secondary timeline, the method comprising:
  receiving and digitizing an analog waveform signal with an analog to digital converter;
  displaying, on a display section of the digital oscilloscope and along a first primary waveform timeline, a first waveform record or segment of the digitized waveform signal, comprising a first non-periodic triggering event;
  displaying, on the display section of the digital oscilloscope and along a second primary waveform timeline, a next waveform record or segment of the digitized waveform signal, comprising a next non-periodic triggering event, the next non-periodic triggering event occurring a non-zero elapsed time period after the first non-periodic triggering event, the second primary waveform timeline being substantially parallel to the first primary waveform timeline, the next non-periodic triggering event further being aligned with the first non-periodic triggering event on a secondary timeline transverse to the first primary waveform timeline and the second primary waveform timeline; and
  offsetting the second primary waveform timeline vertically and horizontally from the first primary waveform timeline and along the secondary timeline by an amount corresponding to the elapsed time period.

2. The method as in claim 1 further comprising:
  identifying the first event from a first stored waveform record that comprises a plurality of triggering events;
  generating first image data representing the first waveform record or segment that includes the identified first event;
  identifying the next event from the first stored waveform record, the next event separated from the first event by the elapsed time period; and
  generating next image data representing the next waveform record or segment that includes the identified next event.

3. The method as in claim 2 further comprising displaying the first waveform record or segment on a first display portion based on the first image data and simultaneously displaying the next waveform record or segment on a next display portion, offset vertically and horizontally from the first display portion, and such that the next event is aligned on the time axis with the first event, based on the next image data.

4. A method for displaying, on a digital oscilloscope, segments of a waveform along a sequence of waveform timelines, the method comprising:
  receiving and digitizing an analog non-periodic waveform signal with an analog to digital converter;
  displaying, on a display section of the digital oscilloscope and along a first waveform timeline, a first decayed waveform record segment of the digitized non-periodic waveform having a first variable image and a first non-periodic triggering event;
  simultaneously displaying, on the display section of the digital oscilloscope and along a second waveform timeline, a next decayed waveform record segment of the digitized non-periodic waveform, the next decayed segment having a next non-periodic triggering event and a next variable image that differs from the first variable image in accordance with a position of the waveform segment along a time axis transverse to the first waveform timeline and the second waveform timeline, the next non-periodic triggering event occurring a non-zero elapsed time period after the first non-periodic triggering event, the second waveform timeline being substantially parallel to the first waveform timeline; and
  offsetting the next decayed segment vertically and horizontally from the first decayed segment by an amount corresponding to the elapsed time period.

5. The method as in claim 4 further comprising varying an image intensity of the first and next waveform segments in accordance with the position of each waveform segment along the time axis.

6. The method as in claim 4 further comprising varying an image size of the first and next waveform segments in accordance with the position of each waveform segment along the time axis.

7. A system for displaying, on a digital oscilloscope, triggered waveform record segments of a digitized waveform along a sequence of waveform timelines, comprising:
  an analog to digital converter configured to receive and digitize an analog waveform;
  a display section of the digital oscilloscope;
  a program memory for storing executable instructions;

a processor operable to access and execute the instructions stored within the memory for displaying, on the display section of the digital oscilloscope and along a first waveform timeline, a first waveform record segment of the digitized waveform comprising a first non-periodic triggering event, displaying, on the display section of the digital oscilloscope and along a second waveform timeline, a next waveform record segment of the digitized waveform comprising a next non-periodic triggering event, the next non-periodic triggering event occurring a non-zero elapsed time period after the first non-periodic triggering event, the second waveform timeline being substantially parallel to the first waveform timeline, the next non-periodic triggering event further being aligned with the first non-periodic triggering event on a time axis transverse to the first waveform timeline and the second waveform timeline, and offsetting the second waveform timeline vertically and horizontally from the first waveform timeline and along the time axis by an amount corresponding to the elapsed time period.

8. The system as in claim 7 further comprising a display for displaying the first and next waveform record segments.

9. The system as in claim 7, wherein the processor is further operable to access and execute the instructions stored within the memory for:
identifying the first event from a first stored waveform record that comprises a plurality of triggering events;
generating first image data representing the first waveform record segment that includes the identified first event;
identifying the next event from the first stored waveform record, the next event separated from the first event by the elapsed time period; and
generating next image data representing the next waveform record segment that includes the identified next event.

10. The system as in claim 9, wherein the processor is further operable to access and execute the instructions stored within the memory for displaying the first waveform record segment on a first display portion based on the first image data and simultaneously displaying the next waveform record segment on a next display portion, offset vertically and horizontally from the first display portion, and such that the next event is aligned on the time axis with the first event, based on the next image data.

11. The system as in claim 7, further comprising:
a user interface for activating and controlling visual detection of anomalies in waveform record events, the interface comprising a plurality of control keys, at least one key for controlling spacing between non-periodic triggering events.

12. A system for displaying, on a digital oscilloscope, segments of a digitized waveform along a sequence of waveform timelines, comprising:
an analog to digital converter configured to receive and digitize an analog non-periodic waveform;
a display section of the digital oscilloscope;
a program memory for storing executable instructions;
a processor operable to access and execute the instructions stored within the memory for displaying, on the display section of the digital oscilloscope and along a first waveform timeline, a first decayed waveform record segment of the digitized non-periodic waveform having a first variable image and a first non-periodic triggering event, simultaneously displaying, on the display section of the digital oscilloscope and along a second waveform timeline, a next decayed waveform record segment of the digitized non-periodic waveform, the next decayed segment having a next non-periodic triggering event and a next variable image that differs from the first variable image in accordance with a position of the waveform segment along a time axis transverse to the first waveform timeline and the second waveform timeline, the next non-periodic triggering event occurring a non-zero elapsed time period after the first non-periodic triggering event, the second waveform timeline being substantially parallel to the first waveform timeline, and offsetting the next decayed segment vertically and horizontally from the first decayed segment by an amount corresponding to the elapsed time period.

13. The system as in claim 12 further comprising a display for displaying the first and next segments.

14. The system as in claim 12 wherein the processor is further operable to access and execute the instructions stored within the memory for varying an image intensity of the first and next variable images.

15. The system as in claim 12 wherein the processor is further operable to access and execute the instructions stored within the memory for varying an image size of the first and next variable images.

16. The method of claim 1, in which the displaying a first waveform record or segment of the digitized waveform signal further comprises displaying the first waveform record or segment of the digitized waveform signal on a first rasterizing plane, and in which the displaying a next waveform record or segment of the digitized waveform signal further comprises displaying the next waveform record or segment of the digitized waveform signal on a second rasterizing plane.

17. The method of claim 4, in which the displaying a first decayed waveform record segment of the digitized non-periodic waveform signal further comprises displaying the first decayed waveform record segment of the digitized non-periodic waveform signal on a first rasterizing plane, and in which the displaying a next decayed waveform record segment of the digitized non-periodic waveform further comprises displaying the next decayed waveform record segment of the digitized non-periodic waveform on a second rasterizing plane.

* * * * *